US009440375B2

(12) United States Patent
Fukaya et al.

(10) Patent No.: US 9,440,375 B2
(45) Date of Patent: *Sep. 13, 2016

(54) BLANK FOR MOLD PRODUCTION AND METHOD FOR MANUFACTURING MOLD

(71) Applicant: Shin-Etsu Chemical Co., Ltd., Chiyoda-ku (JP)

(72) Inventors: Souichi Fukaya, Niigata (JP); Hideo Nakagawa, Niigata (JP); Kouhei Sasamoto, Niigata (JP)

(73) Assignee: SHIN-ETSU CHEMICAL CO., LTD., Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/892,523

(22) Filed: May 13, 2013

(65) Prior Publication Data

US 2013/0306596 A1    Nov. 21, 2013

(30) Foreign Application Priority Data

May 16, 2012   (JP) ................................. 2012-112520

(51) Int. Cl.
| | |
|---|---|
| *B32B 15/00* | (2006.01) |
| *B29C 33/38* | (2006.01) |
| *G03F 7/00* | (2006.01) |
| *B82Y 10/00* | (2011.01) |
| *B82Y 40/00* | (2011.01) |

(52) U.S. Cl.
CPC ............ *B29C 33/3842* (2013.01); *B82Y 10/00* (2013.01); *B82Y 40/00* (2013.01); *G03F 7/0002* (2013.01)

(58) Field of Classification Search
None
See application file for complete search history.

(56) References Cited

U.S. PATENT DOCUMENTS

| 4,396,677 A | * | 8/1983 | Intrater et al. ................. 428/408 |
|---|---|---|---|
| 6,022,622 A | * | 2/2000 | Domoto et al. .............. 428/408 |

(Continued)

FOREIGN PATENT DOCUMENTS

| CN | 103229099 A | 7/2013 |
|---|---|---|
| JP | 63-58446 A | 3/1988 |

(Continued)

OTHER PUBLICATIONS

Decision to Patent mailed Apr. 7, 2015 issued in corresponding Japanese patent application No. 2012-112520.

(Continued)

*Primary Examiner* — Humera Sheikh
*Assistant Examiner* — Seth Dumbris
(74) *Attorney, Agent, or Firm* — Oblon, McClelland, Maier & Neustadt, L.L.P.

(57) ABSTRACT

A hard mask film 2 provided on substrate 1 is formed by tin-containing chromium-containing material. In the chromium-containing material including tin, which forms the hard mask film 2, the etching resistance to fluorine-containing dry etching is equal to or higher than the etching resistance of the tin-free chromium-containing material, and it shows a significantly high etching rate as compared with a chromium-containing material free of tin under conditions for chlorine-containing dry etching. As a result, the time for chlorine-containing dry etching is shortened, and damage to a resist pattern is reduced. Thus, high-precision pattern transfer can be performed. The present invention provides a novel technique for increasing etching process-ability by increasing a dry-etching rate of a hard mask film made of a chromium-containing material while assuring a hard mask function of the hard mask film.

14 Claims, 3 Drawing Sheets

(56) References Cited

U.S. PATENT DOCUMENTS

| | | | |
|---|---|---|---|
| 9,158,192 B2* | 10/2015 | Fukaya | G03F 1/29 |
| 2006/0251973 A1* | 11/2006 | Takaki et al. | 430/5 |
| 2007/0076833 A1* | 4/2007 | Becker et al. | 375/377 |
| 2007/0212619 A1 | 9/2007 | Yoshikawa et al. | |
| 2010/0255411 A1 | 10/2010 | Sato et al. | |
| 2011/0104595 A1* | 5/2011 | Hayashi et al. | 430/5 |
| 2013/0230796 A1* | 9/2013 | Yoshikawa et al. | 430/5 |
| 2013/0309600 A1 | 11/2013 | Fukaya et al. | |

FOREIGN PATENT DOCUMENTS

| | | |
|---|---|---|
| JP | 2005-84682 A | 3/2005 |
| JP | 2007-33470 | 2/2007 |
| JP | 2007-241060 | 9/2007 |
| JP | 2009-98689 A | 5/2009 |
| JP | 2009-206338 | 9/2009 |
| JP | 2011-207163 | 10/2011 |
| JP | 2013-238778 A | 11/2013 |
| WO | WO 2012/070209 A1 | 5/2012 |

OTHER PUBLICATIONS

Office Action and Search Report dated Aug. 27, 2015 issued in corresponding Chinese patent application No. 20131012369.4.
Extended European Search Report issued Sep. 6, 2013, in Patent Application No. 13167564.7.

* cited by examiner

BLANK FOR MOLD PRODUCTION AND METHOD FOR MANUFACTURING MOLD

CROSS REFERENCE TO RELATED APPLICATION

The present application claims the benefit of the filing date of Japanese application no. 2012-112520, filed on May 16, 2012.

TECHNICAL FIELD

The present invention relates to a blank for producing a mold which can be used in a nanoinprint technical field and a method for producing a mold using such a blank.

BACKGROUND ART

Nanoinprint technology has been expected as a lithography method that does not require the use of an expensive exposure device, and focused as a novel micro-processing method for fine processing in manufacture of a semiconductor integrated circuit and a novel micro-processing method for producing a next-generation optical disc.

For forming a fine pattern by nanoinprint, there are the following methods: a method including pressing a mold serving as a mold form for three-dimensional pattern onto thermally plasticized resin to shape the resin, followed by cooling to obtain a three-dimensional resin pattern; and a method including applying an optically curable resin solution on a process substrate and irradiating light on the substrate in a state of being pressed by the mold to obtain an optically cured three dimensional resin pattern. In any of these methods, the processing accuracy of a mold provided as an original edition is important just as in the case with processing accuracy required for a photomask in optical lithography.

Examples a substrate used for producing a mold include a quartz substrate, a silicon substrate subjected to film-formation of a silicon oxide film, a silicon substrate, and a silicon carbide substrate. In particular, among them, the quartz substrate is also usefully employed in optical imprint and thermal inprint.

On the other hand, in an optical lithographic technique as a technique for processing a quartz substrate with high precision, a Levenson type mask has been already used in the production. In the case of carrying out the production of such a mask, a quartz substrate is processed by fluorine-containing dry etching using as a hard mask film a chromium-containing film, which is also used as a light-shielding film and has high etching resistance to fluorine-containing dry etching.

This processing technique can be directly applied to a method for manufacturing a mold. For example, JP 2011-207163 A (Patent Literature 1) proposes a mold production substrate in which a chromium-oxide-nitride-carbide film, which has been used as a light-shielding material in a photomask, is provided as a hard mask film. In addition, there is proposed a substrate for production of a mold having a chromium-containing material layer on the surface side thereof and a tantalum-containing material layer on the substrate side thereof (JP 2009-206338 A: Patent Literature 2).

CITATION LIST

Patent Literatures

Patent Literature 1: JP 2011-207163 A
Patent Literature 2: JP 2009-206338 A
Patent Literature 3: JP 2007-241060 A
Patent Literature 4: JP 2007-33470 A

SUMMARY OF THE INVENTION

Technical Program

Along with a reduction in pattern size of a semiconductor integrated circuit or an optical device, a further reduction in pattern size for mold production has been also desired. Such a miniaturization will lead to further request of a reduction in film thickness of a resist film in lithography. This is because a problem such as an inappropriate resist pattern shape or peeling may occur when the resist film is too thick with respect to a pattern line width.

Thus, in order to produce a mold having a finely formed pattern, a mold blank that allows pattern processing with a thinner resist film as compared with the conventional one.

A hard mask film for substrate processing as disclosed in Patent Literatures 1 and 2 is required to have high etching resistance under etching conditions for substrate processing. A chromium-containing material is known as such a material. The chromium-containing material is useful as a hard mask material for precisely processing a substrate such as a quartz substrate processable with fluorine-containing dry etching.

However, a photoresist film, which serves as an etching mask when patterning on a chromium-containing material film, has insufficient etching resistance to chlorine-containing dry etching. It is also known that there is a problem of generating bias in chlorine-containing dry etching (see, for example, Patent Literature 3). Thus, a technique for more easily patterning a chromium-containing material film has been desired.

Furthermore, in JP 2007-33470 A (Patent Literature 4), there is disclosed a method for increasing an etching rate in chlorine-containing dry etching by reducing the content of chromium in a chromium-containing material film. However, a decrease in content of chromium in the chromium-containing film tends to cause a decrease in etching resistance to fluorine-containing dry etching.

The present invention has been made in consideration of the above problem and an object thereof is to provide a novel technique for increasing etching processability by increasing a dry-etching rate of a hard mask film made of a chromium-containing material while assuring a hard mask function of the hard mask film.

Solution to Problem

To solve the aforementioned problems, the blank for mold production of the present invention includes a hard mask film made of a chromium-containing material including tin on a substrate capable of being etched by fluorine-containing dry etching.

Preferably, the chromium-containing material including tin has a content of tin of not under 0.01 times than the content of chromium in atomic ratio and not over 2 times than the content of chromium in atomic ratio.

Preferably, the chromium-containing material is any one of a tin-chromium metal, tin-chromium oxide, tin-chromium nitride, tin-chromium carbide, tin-chromium oxide nitride, tin-chromium oxide carbide, tin-chromium nitride carbide, and tin-chromium oxide nitride carbide.

For example, the substrate capable of being etched by fluorine-containing dry etching is a substrate of a silicon-containing material.

Preferably, the substrate capable of being etched by fluorine-containing dry etching is a quartz substrate.

The method for manufacturing a mold according to the present invention is a method for manufacturing a mold using the above blank. The method includes steps of forming a hard mask pattern by subjecting the hard mask film to chlorine-containing dry etching, the hard mask being made of a chromium-containing material including tin; and subjecting the substrate to fluorine-containing dry etching using the hard mask pattern as a mask.

Advantageous Effects of Invention

Effects of the Invention

In the present invention, the hard mask film is made of a chromium-containing material including tin. Such a chromium-containing material shows high resistance against fluorine-containing dry etching. On the other hand, a high etching rate is obtained in chlorine-containing dry etching.

For this reason, pattern transfer to the hard mask film can be easily performed with high precision even if the resist is thinned. Furthermore, a sufficient mask effect can be obtained when the substrate is processed by fluorine-containing dry etching. As a result, manufacture of the mold for nanoinprint having a high precision pattern can be easily produced.

DESCRIPTION OF EMBODIMENTS

Figure 1:
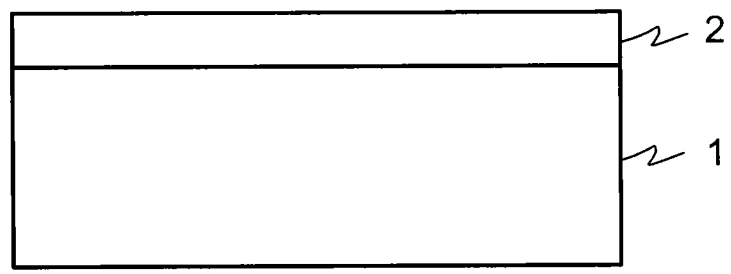
FIG. 1 is a cross-sectional diagram illustrating the configuration of a blank for mold production according to an embodiment of the present invention.

Hereinafter, an embodiment of the present invention will be described with reference to drawings.

The blank for mold production of the present invention includes a hard mask film made of a chromium-containing material including tin on a substrate capable of being etched by fluorine-containing dry etching. Here, such a hard mask film is not limited to the configuration thereof where the entire film is made of a chromium-containing material including tin. Alternatively, the hard mask film may have a multilayer structure and at least one of the layers may be made of a chromium-containing material including tin. In the latter configuration, the layers made of a chromium-containing material including tin are considered as a single hard mask film, and layers made of a chromium-containing material free of tin are considered as another hard mask film. These configurations are also included in the scope of the present invention.

First, the chromium-containing material including tin will be described.

Since a chromium-containing material has comparatively good chemical stability, it has been widely used as an optical film material, especially a light-shielding film material. Since the chromium-containing material has a high resistance against fluorine-containing etching gas, it can be safely used as an etching mask for patterning a silicon-containing material with fluorine-containing dry etching.

Incidentally, when forming a chromium-containing material film by sputtering, it is common that the chromium target of the high grade which does not contain a metal impurity is used. In general, this is due to the reasons such as an empirically known fact that a decrease in etching rate of the chromium-containing material film occurs when a metal impurity is mixed into a chromium-containing material film formed by sputtering.

The present inventors have repeatedly performed various examinations on a novel procedure for increasing the dry-etching rate of a film made of a chromium-containing material while assuring design flexibility of the film. As a result, the present inventors have completed the present invention by finding out that, when tin is included in the chromium-containing material film, an increase in etching rate occurs at the time of carrying out chlorine-containing dry etching.

In other words, conventionally, film formation of a chromium-containing material film is performed to avoid contamination of metal impurities in the film by using a high-purity chromium target so that the etching rate of the chromium-containing material film is prevented from decreasing. In contrast, based on the above new finding, the present inventors have decided to perform film formation so that tin is intentionally added to a chromium-containing material film.

According to the investigation of the present inventors, the content (concentration) of tin in a chromium-containing material film is preferably not under 0.01 times, more preferably not under 0.1 times, further preferably not under 0.3 times than the content of chromium in atomic ratio.

A chromium-containing material film where the content of tin is not under 0.01 times than that of chromium in atomic ratio shows a significantly increased etching rate under general conditions for chlorine-containing dry etching including oxygen. This effect becomes large as the content of tin increases. The upper limit of the content of tin is not particularly limited. However, an excess content of tin may lead to a difficulty in obtaining a film having substantially the same characteristics as those of a tin-free chromium-containing material. Thus, the content of tin is preferably set to not over 2 times, more preferably not over 1.5 times than that of chromium in atomic ratio.

That is, there is no need of including tin at the above concentration in all of the layers made of a chromium-containing material, which form a hard mask film of the invention. In practice, however, it is preferred to contain tin at the above concentration in the layers corresponding to 50% or higher of the total layer thickness of the layers made of a chromium-containing material, which form a hard mask film. The value is more preferably 75% or higher. Obviously, the entire hard mask film made of a chromium-containing material includes tin at the above concentration.

The chromium-containing material layers containing tin may be equal in content ratio of tin to chromium, or may be different from one another with respect to a content ratio of tin to chromium. The tin contained in each layer of the hard mask film does not need to be uniformly distributed in each layer, and may have a profile which has a concentration change in the thickness direction (depth direction) of a layer.

For example, if the upper layer is designed to be a tin-free layer or a layer having a low tin content ratio and the lower layer is designed to be a layer having a high tin content ratio, only the etching rate of the lower layer (on the substrate side) can be increased in contrast to the etching rate of the upper layer (on the surface side). Thus, an over etching time can be set short. On the other hand, when the hard mask film is designed so that the tin content ratio is lower at the substrate side, it is possible to easily detect the end by monitoring of chromium at the time of dry-etching.

The above chromium-containing material containing tin is any one of chromium compounds, such as a tin-chromium metal, tin-chromium oxide, tin-chromium nitride, tin-chromium carbide, tin-chromium oxide nitride, tin-chromium oxide carbide, tin-chromium nitride carbide, and tin-chromium oxide nitride carbide. Among them, tin-chromium nitride, tin-chromium oxide nitride, and tin-chromium oxide nitride carbide are particularly preferred.

In the case that a part of the hard mask film is made of a tin-free chromium-containing material, examples of such a chromium-containing material include a chromium metal and chromium compounds such as chromium oxide, chromium nitride, chromium carbide, chromium oxide nitride, chromium oxide carbide, chromium nitride carbide, and chromium oxide nitride carbide. Among them, chromium nitride, chromium oxynitride, and chromium oxide nitride carbide are particularly preferred.

Although the chromium-containing material layer containing tin of the present invention can be formed according to a publicly known method for forming a typical chromium-containing material layer (see, for example, Patent Literatures 1 to 4), a film, excellent in uniformity, can be easily obtained using a sputtering method such as DC sputtering or RF sputtering.

When carrying out sputtering film formation of the chromium-containing material layer containing tin of the present invention, a chromium target added with tin (tin-added chromium target) may be used. The chromium target and the tin target may be independently provided to perform co-sputtering (simultaneous sputtering). Alternatively, a complex target having a chromium region and a tin region in a single target may be used. Furthermore, co-sputtering may be performed using both the above complex target and the chromium target.

In the case of adding tin to the chromium target, it may be added as a metal tin or may be added as a tin compound such as tin oxide, tin nitride, or ITO.

In the case of carrying out co-sputtering using both a tin-containing target and a tin-free target, the concentration of tin in an inorganic material film can be adjusted not only by controlling the surface area ratios of the respective targets but also by controlling electric power to be applied to each target.

Particularly, if there is a need of changing the ratio of chromium between the chromium-containing material layers including tin or a need of gradual change in ratio of chromium to tin in a single layer, co-sputtering is performed using a combination of a tin-containing target and a tin-free target or a combination of targets with different tin contents to change an applied power ratio between the targets. As a result, layers with different desired tin content ratios can be easily formed.

The sputtering gas used in film formation of the hard mask film of the present invention is suitably selected according to the composition of the film. When a light element is added to the inside of the film, the use of reactive sputtering with sputtering gas and the addition of one or more elements selected from oxygen, nitrogen, and carbon are performed just as in the case with the film-formation of a publicly known chromium-containing material layer.

For example, only argon gas may be used when the film-formation of a chromium-containing material film including tin that does not contain a light element is performed. In the case of film-formation of an inorganic material film containing a light element, reactive sputtering may be performed in one or more kinds of reactive gas, such as nitrogen gas, nitrogen oxide gas, oxygen gas, carbon oxide gas, or carbon hydride, or mixture gas of any of those reactive gas and inert gas such as argon.

Furthermore, in the case of designing a hard mask film as a structural component a chromium-containing material layer having a chromium-containing material layer containing tin, the amount of a light element added may be found within in the rage used for designing a publicly known chromium-containing material layer.

The flow rate of sputtering gas is adjusted suitably. The gas flow rate may be constant in the process of film-formation. Alternatively, the gas flow rate may be changed according to the film composition when there is a need of changing the amount of oxygen or the amount of nitrogen in a thickness direction.

The hard mask film of the present invention may have the same film thickness as that of the conventional hard mask. Although it is designed depending on the depth or the like at the time of processing a substrate, and the thickness of the hard mask film is 1 to 10 nm in general.

The etching resistance of the chromium-containing material film containing tin under the conditions for fluorine-containing dry etching is equal to or higher than the etching resistance of the tin-free chromium-containing material.

On the other hand, the chromium-containing material film including tin can be subjected to dry-etching with chlorine-containing gas in a manner similar to the chromium-containing material film free of tin, and it shows a significantly high etching rate as compared with a chromium-containing material free of tin.

Such a chlorine-containing dry etching can be carried out, for example, using gas of chlorine gas and oxygen gas at a mixture ratio ($Cl_2$ gas:$O_2$ gas) of 1:2 to 20:1 in terms of volumetric flow rate, and optionally mixed with inert gas such as helium. As described in Patent Reference 2, when a chlorine-containing material film including tin is a thin film, chlorine-containing dry etching free of oxygen may be performed.

Thus, the chromium-containing material film containing tin has both sufficient etching resistance to fluorine-containing dry etching and a high etching rate to chlorine-containing dry etching. Thus, in a blank for production of a nanoinprint mold having a hard mask film made of a chromium-containing material as disclosed in Patent Literatures 1 and 2, it is possible to enhance hard mask functions and reduce the load to the resist film at the time of patterning the hard mask film when the hard mask film is made of a chromium-containing material including tin. As a result, manufacture of the highly precise mold for nanoinprint becomes possible.

As a substrate used in a blank for mold production of the present invention, any kind of a substrate can be applied as long as it is processable by fluorine-containing dry etching. Examples of such a substrate include a quartz substrate, a silicon substrate, a silicon substrate, a silicon carbide. Among them, the quartz substrate is preferred because it is applicable to thermal inprint and optical inprint.

FIG. 1 is a cross-sectional diagram illustrating an exemplary configuration of a blank for production of a mold applicable to the field of nanoinprint technology. In the configuration of the blank illustrated in the figure, a hard mask film 2 made of a chromium-containing material including tin is formed on a quartz substrate 1 which is a silicon-containing material substrate possible to be etched by fluorine-containing dry etching.

As a process for manufacturing a mold for nanoinprint using such a blank, completely the same process as the conventionally known process for processing a photomask blank having a hard mask film made of a chromium-containing material can be employed (see, for example, Patent References 1 and 2) can be employed.

Figure 2:
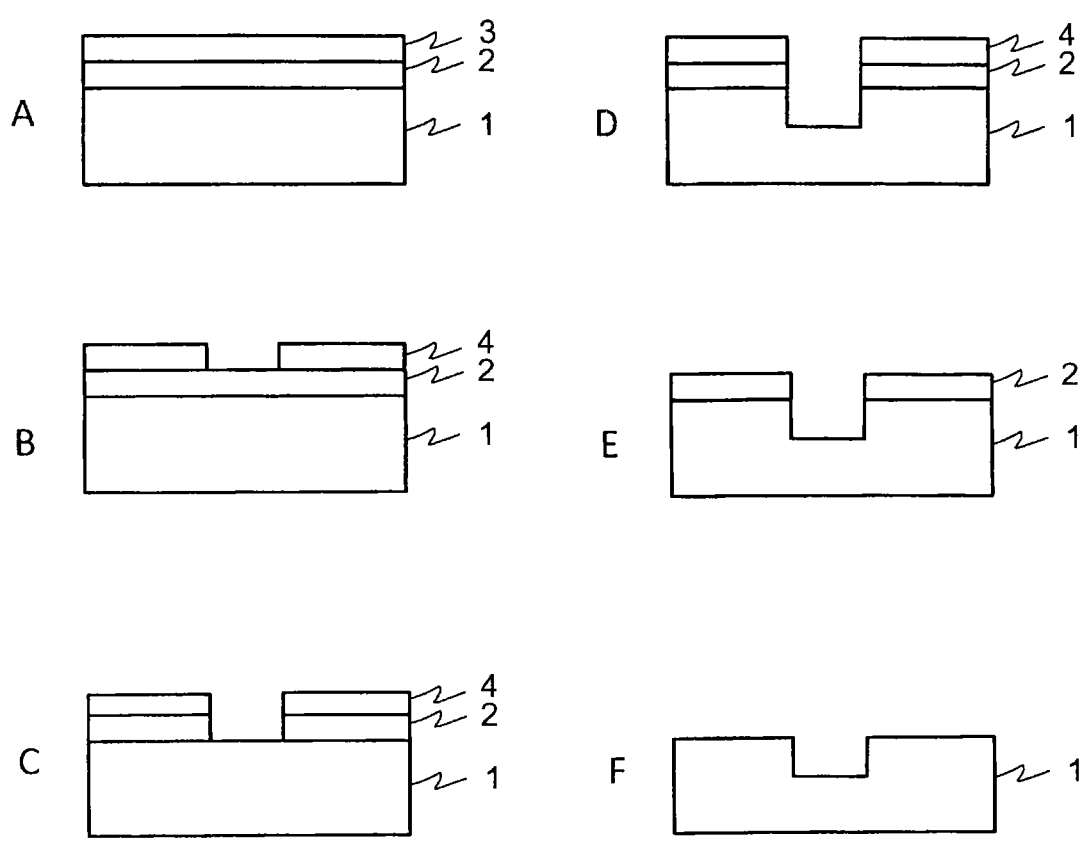
FIG. 2 is a diagram illustrating a process for manufacturing a mold according to an embodiment of the present invention.

FIG. 2 is a diagram illustrating a process for manufacturing a mold according to an embodiment of the present invention. First, a resist film 3 is formed by applying photoresist on the hard mask film 2 of the blank illustrated in FIG. 1 (FIG. 2A).

Next, in order to carry out patterning to obtain a resist pattern for to carry out patterning for protecting the portion of the hard mask film 2 to leave it untouched, electron beams are irradiated in pattern on the resist film 3. After subsequent steps of development and so on, a resist pattern 4 is obtained (FIG. 2B).

Using this resist pattern 4 as a mask, the hard mask film 2 is patterned by chlorine-containing dry etching containing oxygen (FIG. 2C). Since hard mask film 2 which comprises a tin-containing chromium-containing material has a high etching rate at this time, an etching time is shortened to reduce damage of the resist pattern 4. As a result, it is high-precision pattern transfer can be performed.

The remaining resist pattern 4 may be removed, but not indispensable.

Subsequently, using the patterned hard mask film 2 is used as a mask, the quartz substrate 1 is etched by a predetermined depth by fluorine-containing dry etching (FIG. 2D).

Finally, the resist pattern 4 is removed (FIG. 2E). Subsequently, the hard mask film 2 is removed by chlorine-containing dry etching containing oxygen. Thus, a mold for nanoinprint is completed (FIG. 2F).

In other words, the mold is produced by a method including the steps of: etching the hard mask film 2 made of a chlorine-containing material including tin by chlorine-containing dry etching to form a hard mask pattern; and subjecting the quartz substrate 1 to fluorine-containing dry etching using the had mask pattern as a mask.

Alternatively, a mold for nanoinprint may be produced using the above mold as a master. In these cases, UV-curable resin or the like is applied to the master mold obtained through the above process, and the quartz substrate on which a CrSn film is formed is pressed against the master mold.

Then, UV light is illuminated from a mercury lamp on the master mold side to the CrSn film to form a UV-curable resin pattern thereon. The CrSn film is etched using the UV-curable resin pattern as a mask. Next, the quartz substrate is etched, and finally the CrSn film is removed. As a result, a mold for nanoinprint is completed.

[Evaluation Experiment Dry-Etching Characteristics]

As an example of an experiment for evaluating dry-etching characteristics, film formation was performed on a square-shaped quartz substrate of 152 mm on a side and 6 mm in thickness by a DC sputtering method using co-sputtering with a chromium target and a tin target which were independently disposed to obtain two different 44-nm thick CrON films with different tin concentration.

The content of tin in the CrON film was adjusted by adjusting power individually applied to the chromium target and the tin target. Sputtering gas was a gas mixture of argon gas, oxygen gas, and nitrogen gas.

For comparison, furthermore, a tin-free CrON film was also formed using a Cr target.

Two or more of each of the above three samples of the chromium-containing material films were produced. The composition analysis of the chromium-containing material films was performed using ESCA (JPS-9000MC, manufactured by JEOL).

These samples were compared with one another with respect to an etching rate (clear time) of a 44-nm thick chromium-containing film with chlorine-containing dry etching including oxygen.

Figure 3:
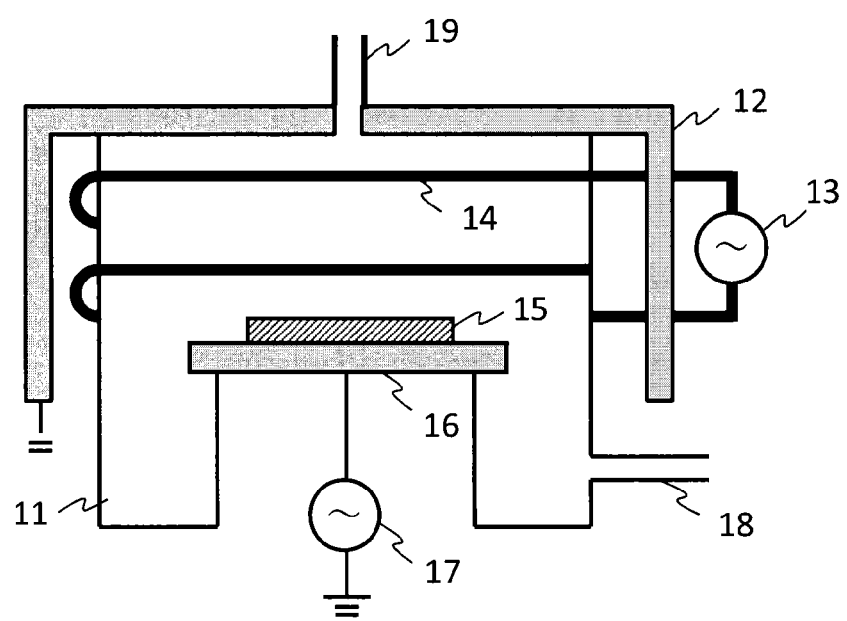
FIG. 3 is a diagram schematically illustrating the configuration of a device used for dry-etching.

FIG. 3 is a diagram schematically illustrating the configuration of a device used for chlorine-containing dry etching including oxygen. In the figure, reference numeral 11 denotes a chamber, 12 denotes a counter electrode, 13 denotes a high frequency oscillator for inductively coupled plasma (ICP), 14 denotes an antenna coil, 15 denotes a sample, 16 denotes a flat electrode, 17 denotes a RIE high frequency oscillator, 18 denotes an exhaust opening, and 19 denotes a gas inlet. FIG. 3 also serves as a diagram schematically illustrating the configuration of a device used for fluorine-containing dry etching as described below.

The dry etching was performed under the following conditions: The inner pressure of the chamber was set to 6 mTorr, $Cl_2$ (185 sccm), $O_2$ (55 sccm), and He (9.25 sccm) were supplied as etching gas, a voltage of 700 V (pulse) was applied to the RIE high frequency oscillator 17, and a power of 400 W (continuous discharge) was supplied to the ICP-generation high frequency oscillator 13.

Clear times of the respective samples of Example 1, Example 2, and Comparative Example when chlorine-containing dry etching including oxygen was performed under the above conditions were obtained from reflectance measurements on these samples. The results are shown in Table 1. Here, the clear times are represented by a value relative to the clear time of a sample in Comparative Example defined as 1.

TABLE 1

| Sample | Sn/Cr (mol/mol) | Clear time (Relative value) |
| --- | --- | --- |
| Example 1 | 0.19 | 0.63 |
| Example 2 | 0.11 | 0.85 |
| Comparative Example | 0.0 | 1 |

As is evident from the above results, the samples of Examples 1 and 2, which contains tin in a CrON film showed an increase in etching rate at the time of chlorine-containing dry etching including oxygen as compared with the sample of Comparative Example, which does not contain Sn.

These samples were compared with one another with respect to the fluorine-dry etching rate (clear time) of the CrON film of 44 nm in film thickness. The fluorine-dry etching was performed under the following conditions: The inner pressure of the chamber was set to 5 mTorr, $SF_6$ (18 sccm) and $O_2$ (45 sccm) were supplied as etching gas, a voltage of 54 V (continuous discharge) was applied to the RIE high frequency oscillator 17, and a power of 325 W (continuous discharge) was supplied to the ICP-generation high frequency oscillator 13.

Clear times of the respective samples of Example 1, Example 2, and Comparative Example when fluorine-containing dry etching was performed under the above conditions were obtained from reflectance measurements on these samples. The results are shown in Table 2. Here, the clear time ratio is compared by the ratio of the clear time of the fluorine-containing dry etching to the clear time of the chlorine-containing dry etching including oxygen.

TABLE 2

| Sample | Sn/Cr (mol/mol) | Clear time ratio |
|---|---|---|
| Example 1 | 0.19 | 13.6 |
| Example 2 | 0.11 | 11.1 |
| Comparative Example | 0 | 10.3 |

As is evident from the above results, In each of the samples of Examples 1 and 2, which contain tin in the CrON film, in comparison with the sample of Comparative Example, which does not contain Sn, there is an increase in ratio of clear time of the fluorine-containing dry etching to the clear time of the chlorine-containing dry etching including oxygen. Specifically, the ratio between the clear time of the chlorine-containing dry etching including oxygen and the clear time of the fluorine-containing dry etching is 1:11.

EXAMPLES

Example 1

Using a direct sputtering device, a hard mask film (10 nm in film thickness) made of chromium and tin was formed on a quartz substrate.

Using two different targets, a chromium target and a tin target, as targets, film-formation was performed on the quartz substrate in rotation at 30 rpm. Using Ar as sputtering gas, the gas pressure in a chamber is adjusted to 0.1 Pa.

When the composition of this light-shielding film was investigated by ESCA, it was Cr:Sn=9:1 (atomic ratio).

Subsequently, chemical amplification negative resist was applied 100 nm in thickness, and then subjected to exposure and development to carry out patterning. Next, using this resist pattern as a mask, dry etching was performed with fluorine gas as etching gas to pattern the hard mask film (CrSn film).

Subsequently, using both the above resist pattern and the hard mask pattern as masks, dry etching was performed with fluorine gas as etching gas to dry etch an unmasked portion of the quartz substrate in thickness of 60 nm.

The above etching was performed under the following conditions: The inner pressure of the chamber was set to 5 mTorr, $Cl_2$ (185 sccm) and $O_2$ (45 sccm) were supplied as etching gas, a voltage of 54 V (continuous discharge) was applied to the RIE high frequency oscillator 17, and a power of 325 W (continuous discharge) was supplied to the ICP-generation high frequency oscillator 13.

Subsequently, the resist pattern is removed. Dry etching was further performed using mixture gas of chlorine and oxygen. The above hard mask film (CrSn film) was removed by the etching, and a mold for imprint was completed.

The above etching was performed under the following conditions: The inner pressure of the chamber was set to 6 mTorr, $Cl_2$ (185 sccm) and $O_2$ (55 sccm), and He (9.25 sccm) were supplied as etching gas, a voltage of 700 V (pulse) was applied to the RIE high frequency oscillator 17, and a power of 400 W (continuous discharge) was supplied to the ICP-generation high frequency oscillator 13.

As described above, in the present invention, the hard mask film formed on the blank was a film made of a chromium-containing material including tin. The film made of chromium-containing material including tin has sufficient etching resistance under conditions for fluorine-containing dry etching. On the other hand, under conditions for chlorine-containing dry etching, it shows a significantly high etching rate as compared with a chromium-containing film free of tin.

Accordingly, the time for chlorine containing dry etching is shortened, and damage to the resist pattern is reduced. Thus, high-precision pattern transfer can be performed.

INDUSTRIAL APPLICABILITY

The present invention assures the facilitated production of a mold for nanoinprint with high-precision.

REFERENCE SINS LIST

1 Transparent substrate
2 Hard mask film
3 Resist film
4 Resist pattern
11 Chamber
12 Counter electrode
13 High frequency oscillator for ICP development
14 Antenna coil
15 Sample
16 Flat electrode
17 High frequency oscillator for RIE
18 Exhaust opening
19 Gas inlet

The invention claimed is:

1. A blank for mold production comprising:
a hard mask film comprising a material comprising chromium and tin, and
a substrate capable of being etched by fluorine-containing dry etching,
wherein the hard mask film is disposed on the substrate, and the hard mask film has a thickness of 1 to 10 nm,
wherein the material comprising chromium and tin has a content of tin of not under 0.01 times the content of chromium in atomic ratio and not over 2 times the content of chromium in atomic ratio, and the concentration of tin in the material comprising chromium and tin varies in a thickness direction of the material, and
wherein the substrate capable of being etched by fluorine-containing dry etching is a substrate comprising a silicon-containing material.

2. The blank according to claim 1, wherein
the material comprising chromium and tin is selected from the group consisting of a tin-chromium metal, a tin-chromium oxide, a tin-chromium nitride, a tin-chromium carbide, a tin-chromium oxide nitride, a tin-chromium oxide carbide, a tin-chromium nitride carbide, and a tin-chromium oxide nitride carbide.

3. The blank according to claim 1, wherein
the substrate capable of being etched by fluorine-containing dry etching is a quartz substrate.

4. A method for manufacturing a mold using the blank according to claim 1, the method comprising:
etching the hard mask film comprising the material comprising chromium and tin by chlorine-containing dry etching to form a hard mask pattern; and
etching the substrate by fluorine-containing dry etching using the hard mask pattern.

5. The method for manufacturing a mold according to claim 4, wherein
the material comprising chromium and tin is selected from the group consisting of a tin-chromium metal, a tin-chromium oxide, a tin-chromium nitride, a tin-chromium carbide, a tin-chromium oxide nitride, a tin-chromium oxide carbide, a tin-chromium nitride carbide, and a tin-chromium oxide nitride carbide.

6. The method for manufacturing a mold according to claim 4, wherein
the substrate capable of being etched by fluorine-containing dry etching is a quartz substrate.

7. The blank according to claim 1, wherein
the material comprising chromium and tin is a tin-chromium metal.

8. The blank according to claim 1, wherein
the material comprising chromium and tin is a tin-chromium oxide.

9. The blank according to claim 1, wherein
the material comprising chromium and tin is a tin-chromium nitride.

10. The blank according to claim 1, wherein
the material comprising chromium and tin is a tin-chromium carbide.

11. The blank according to claim 1, wherein
the material comprising chromium and tin is a tin-chromium oxide nitride.

12. The blank according to claim 1, wherein
the material comprising chromium and tin is a tin-chromium oxide carbide.

13. The blank according to claim 1, wherein
the material comprising chromium and tin is a tin-chromium nitride carbide.

14. The blank according to claim 1, wherein
the material comprising chromium and tin is a tin-chromium oxide nitride carbide.

* * * * *